United States Patent
Suyama et al.

(10) Patent No.: US 9,054,000 B2
(45) Date of Patent: Jun. 9, 2015

(54) SOLID-STATE IMAGING DEVICE

(71) Applicant: HAMAMATSU PHOTONICS K.K., Hamamatsu-shi, Shizuoka (JP)

(72) Inventors: Motohiro Suyama, Hamamatsu (JP); Akiomi Ujima, Hamamatsu (JP); Kentaro Maeta, Hamamatsu (JP); Hisanori Suzuki, Hamamatsu (JP); Masaharu Muramatsu, Hamamatsu (JP); Fumio Iwase, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 224 days.

(21) Appl. No.: 13/666,149

(22) Filed: Nov. 1, 2012

(65) Prior Publication Data
US 2013/0107097 A1 May 2, 2013

(30) Foreign Application Priority Data
Nov. 2, 2011 (JP) ................................. 2011-241354

(51) Int. Cl.
*H04N 5/225* (2006.01)
*H01L 27/146* (2006.01)

(52) U.S. Cl.
CPC ........ *H01L 27/14618* (2013.01); *H04N 5/2253* (2013.01)

(58) Field of Classification Search
CPC ......... H04N 5/32; H04N 5/372; H04N 5/378; H04N 5/23253
USPC ................................................ 348/302, 311
See application file for complete search history.

(56) References Cited

U.S. PATENT DOCUMENTS

| 5,449,908 | A  | * | 9/1995 | Wadsworth et al. ........... 250/332 |
| 5,652,150 | A  | * | 7/1997 | Wadsworth et al. ............ 438/60 |
| 5,904,495 | A  | * | 5/1999 | Burke et al. .................... 438/98 |
| 6,703,617 | B1 | * | 3/2004 | Spartiotis et al. ........ 250/370.09 |
| 6,721,008 | B2 | * | 4/2004 | Lee et al. ....................... 348/302 |
| 7,796,174 | B1 | * | 9/2010 | Harwit et al. ................. 348/311 |
| 2002/0020801 | A1 | * | 2/2002 | Wadsworth et al. ....... 250/208.1 |
| 2002/0154734 | A1 | * | 10/2002 | Reim .............................. 378/58 |
| 2004/0169771 | A1 | * | 9/2004 | Washington et al. ......... 348/374 |

(Continued)

FOREIGN PATENT DOCUMENTS

| JP | 6-196680 | 7/1994 |
| JP | 2002-135656 | 5/2002 |
| JP | 2003-152952 | 5/2003 |
| JP | 3441101 | 6/2003 |
| JP | 2007-19664 | 1/2007 |
| JP | 4098852 | 3/2008 |

(Continued)

*Primary Examiner* — Timothy J Henn
(74) *Attorney, Agent, or Firm* — Drinker Biddle & Reath LLP (57) ABSTRACT

A solid-state imaging device 2A includes a CCD-type solid-state imaging element 10 having an imaging plane 12 formed of M×N pixels that are two-dimensionally arrayed in M rows and N columns and N signal readout circuits 20 arranged on one end side in the column direction for each of the columns with respect to the plane 12 and for outputting electrical signals according to the magnitudes of charges taken out of the respective columns, respectively, a C-MOS-type semiconductor element 50 for digital-converting and sequentially outputting as serial signals electrical signals output from the circuits 20 for each of the columns, a heat transfer member 80 having a main surface 81a and a back surface 81b, and a cooling block 84 provided on the surface 81b, and the semiconductor element 50 and the surface 81a of the heat transfer member 80 are bonded to each other.

9 Claims, 9 Drawing Sheets

(56) References Cited

U.S. PATENT DOCUMENTS

2005/0184238 A1* 8/2005 Odawara et al. ........... 250/336.2
2012/0261554 A1* 10/2012 Yoshihara et al. ......... 250/208.1

FOREIGN PATENT DOCUMENTS

| | | |
|---|---|---|
| JP | 4173575 | 10/2008 |
| WO | 2008/142968 | 11/2008 |

* cited by examiner

SOLID-STATE IMAGING DEVICE

BACKGROUND OF THE INVENTION

1. Field of the Invention

The present invention relates to a solid-state imaging device.

2. Related Background Art

Japanese Patent Application Laid-Open No. 2002-135656 discloses a solid-state imaging device including an interline CCD architecture section. This solid-state imaging device includes a plurality of charge detection circuits each for converting a charge output from a charge transfer CCD to a voltage signal and a horizontal scanning circuit for sequentially reading out voltage signals output from these charge detection circuits. The horizontal scanning circuit is formed by a CMOS circuit to perform a high-speed readout operation.

Japanese Patent Application Laid-Open No. 2007-19664 discloses a solid-state imaging device including an interline CCD architecture section. This solid-state imaging device includes a pixel array region for which a plurality of photoelectric conversion units are arrayed into rows and columns, vertical CCDs arranged for each of the columns of the pixel array region, transfer electrodes arranged for each of the rows of the pixel array region, and a vertical drive circuit for driving the transfer electrodes so that charges of the photoelectric conversion units are transferred to the vertical CCD and then the charges are vertically transferred in the vertical CCD. Further, at the most downstream side (destination to which a charge is vertically transferred) of each vertical CCD, a circuit for converting a signal charge that has arrived being vertically transferred by the vertical CCD into a voltage signal and a readout circuit for amplifying and holding the voltage signal are provided. The readout circuit is formed by a CMOS circuit, and has amplifier circuits of a number corresponding to the number of columns of the pixel array region and a line memory for holding amplification signals output therefrom.

Japanese Patent Application Laid-Open No. 2003-152952 discloses an image sensor head to be used for reading of an image. This image sensor head includes a CCD sensor and a control circuit. A CCD sensor chip having the CCD sensor and a C-MOS control chip having the control circuit are mounted on a substrate in a separate manner independently of each other. The CCD sensor chip and the C-MOS control chip are directly connected by a plurality of control signal wires of therebetween. There are provided a plurality of CCD sensor chips, and there are provided a plurality of C-MOS control chips corresponding to the CCD sensor chips.

Pamphlet of International Publication No, WO2008/142968 discloses an image sensor head including a CCD sensor chip. The CCD sensor chips includes a plurality of photodiodes each for converting incident light into a charge to thereby generate a signal charge according to the intensity of that light, a plurality of memories for accumulating and storing signal charges generated by those photodiodes, and a register for reading out and transferring signal charges of the plurality of memories. A signal charge generated by the photodiode is sequentially accumulated in memories neighboring a memory while being transferred from the memory. This image sensor head includes a CMOS control chip separate from the CCD sensor chip, and these chips are mounted on a substrate independently of each other.

Japanese Patent Application Laid-Open No. H06-196680 discloses a semiconductor energy detector including a back incident-type CCD. The CCD detects an energy beam such as short-wavelength light.

Japanese Patent No. 3441101 and Japanese Patent No. 4098852 disclose electron tubes including back incident-type CCDs. The CCDs detect electrons emitted from photoelectric surfaces for converting incident light into electrons.

Japanese Patent No. 4173575 discloses an imaging device. In this imaging device, inside a vacuum vessel, there is a built-in photoelectric surface for emitting photoelectrons from a surface opposite to a light incident surface according to incident light and a built-in back incident-type CCD arranged opposed to the photoelectron emitting surface of the photoelectric surface and for detecting as an image a spatial distribution of photoelectrons by a plurality of pixels.

SUMMARY OF THE INVENTION

In a CCD-type solid-state imaging device, if there are an increased number of pixels (number of pixel columns) in the horizontal direction due to a large area of an imaging plane etc., a great amount of heat is generated by a transfer operation when reading out in the horizontal direction. Moreover, if the imaging plane has a wider width in the horizontal direction, the distance between a pixel farthest from an amplifier circuit and the amplifier circuit becomes longer, which causes an increase in noise to be contained in an output signal.

Moreover, depending on the intended use of a solid-state imaging device, this may image a subject moving at a certain constant speed. In the case of, for example, an inspection of a semiconductor element structure built on a semiconductor wafer, imaging of a minute area (for example, several tens of micrometers on a side) on a 12-inch wafer performed in an enlarged manner results in a significantly large number of times of imaging, and a long time is required for the inspection. Therefore, a so-called TDI (Time Delay Integration) operation, which is for relatively moving a solid-state imaging device with respect to a subject and making the CCD charge transfer speed coincident with that relative speed while performing imaging, is performed. This TDI operation allows imaging a large area subject with a high spatial resolution and in a short time. This TDI operation is an operation that is enabled by using a CCD-type solid-state imaging device, and it is unable to perform such an operation in a C-MOS-type solid-state imaging device.

The present invention has been made in view of such problems, and it is an object of the present invention to efficiently release heat generated by a transfer operation when reading out in the horizontal direction and to reduce noise to be contained in an output signal in a CCD-type solid-state imaging device.

In order to solve the problems mentioned above, a solid-state imaging device according to an aspect of the present invention includes a CCD-type solid-state imaging element having an imaging plane formed of M×N (M and N are integers not less than 2) pixels that are two-dimensionally arrayed in M rows and N columns and N first signal readout circuits arranged on one end side in the column direction for each of the columns with respect to the imaging plane and for outputting electrical signals according to magnitudes of charges taken out of the respective columns, respectively, a C-MOS-type first semiconductor element for converting electrical signals output from the first signal readout circuits for each of the columns to digital signals, and sequentially outputting the digital signals of the respective columns as serial signals, a heat transfer member having a first surface and a second surface, and a cooling structure provided on the second surface, in which the first semiconductor element and the first surface of the heat transfer member are bonded to each other.

In this solid-state imaging device, the CCD-type solid-state imaging element has the signal readout circuit arranged at one end in the column direction (vertical direction) thereof, and further, to this signal readout circuit, the C-MOS-type semiconductor element for a serial signal output is connected. By such a configuration, heat generation in the solid-state imaging element can be reduced as compared with the case of providing a horizontal transfer circuit on the solid-state imaging element that is a CCD type. Moreover, heat generation occurs in the semiconductor element, but by the above-described configuration, the semiconductor element is thermally coupled with the cooling structure via the heat transfer member, so that heat in the semiconductor element can be efficiently released.

Moreover, in this solid-state imaging device, the N signal readout circuits are arranged for each of the columns, and electrical signals are output from these signal readout circuits to the semiconductor element for each of the columns. Such a configuration allows dramatically reducing the number of readout columns per output port as compared to the conventional CCD that has output output signals of a plurality of columns from a single output port collectively. Therefore, the read-out rate per one output port can be held down, so that noise dependent on the magnitude of the frequency can be effectively reduced.

As above, by the above-described solid-state imaging device, heat generated by a transfer operation when reading out in the horizontal direction can be efficiently released, and noise to be contained in an output signal can be reduced.

Moreover, in the solid-state imaging device, the first semiconductor element may include a correlated double sampling circuit for reducing noise of electrical signals output for each of the columns from the first signal readout circuits, a buffer for amplifying a signal output from the correlated double sampling circuit, an analog/digital converter circuit for converting a signal output from the buffer to a digital signal, and a multiplexer for sequentially outputting the digital signals of the respective columns output from the analog/digital converter circuit as serial signals.

Moreover, in the solid-state imaging device, at least one of the correlated double sampling circuit, the buffer, the analog/digital converter circuit, and the multiplexer may be covered with the solid-state imaging element when viewed in a normal direction of the imaging plane. Accordingly, at least one of the correlated double sampling circuit, the buffer, the analog/digital converter circuit, and the multiplexer can be suitably protected from detection objects including light such as ultraviolet rays, radiation such as X-rays, or electron beams made incident into the solid-state imaging element.

Moreover, in the solid-state imaging device, the first signal readout circuit of the solid-state imaging element and the first semiconductor element may be electrically connected to each other via a bump electrode. By such a configuration, as compared with such a case that, for example, the first signal readout circuit and the first semiconductor element are connected via a wire, heat generated in the solid-state imaging element can be efficiently released to the cooling structure via the semiconductor element and the heat transfer member.

Moreover, in the solid-state imaging device, a mounting pattern may be provided on the first surface of the heat transfer member, and the first semiconductor element and the mounting pattern may be electrically connected to each other via a bump electrode. By such a configuration, as compared with such a case that, for example, the first semiconductor element and the mounting pattern are connected via a wire, heat generated in the first semiconductor element can be efficiently released to the cooling structure via the heat transfer member.

Moreover, in the solid-state imaging device, the heat transfer member may be made of an insulating material. In this case, the insulating material may be ceramic.

Moreover, in the solid-state imaging device, the solid-state imaging element may further have N second signal readout circuits arranged on the other end side in the column direction for each of the columns with respect to the imaging plane and for outputting electrical signals according to magnitudes of charges taken out of the respective columns, respectively, said solid-state imaging device may further include a C-MOS-type second semiconductor element for converting electrical signals output from the second signal readout circuits for each of the columns to digital signals, and sequentially outputting the digital signals of the respective columns as serial signals, and the second semiconductor element and the first surface of the heat transfer member may be bonded to each other.

By such a configuration, in the case of performing a TDI operation in a direction from the other end side to one end side, it suffices to transfer a charge in that direction, and convert the charge into a serial signal output by the first signal readout circuit and the first semiconductor element. Moreover, in the case of performing a TDI operation in a direction from one end side to the other end side, it suffices to transfer a charge in that direction, and convert the charge into a serial signal output by the second signal readout circuit and the second semiconductor element. Thus, by the above-described solid-state imaging device, the CCD charge transfer direction can be reversed. Therefore, when performing imaging by a TDI operation, a movement of the solid-state imaging device can be reduced, so that the time required for imaging can be shortened.

Moreover, in the solid-state imaging device, the imaging plane may image any of the electron beams, X-rays, and ultraviolet rays.

Moreover, in the solid-state imaging device, the heat transfer member may form a part of a vacuum vessel, the solid-state imaging element and the first semiconductor element may be arranged in the vacuum vessel, and the cooling structure may be arranged out of the vacuum vessel. By such a configuration, detection objects including electron beams and X-rays that are generated in the vacuum vessel can be efficiently imaged in the vacuum vessel. Normally, in a vacuum, heat generated in a solid-state imaging device is hard to be released, but by this configuration, heat generated in the solid-state imaging element and the semiconductor element can be efficiently transferred to the cooling structure via the heat transfer member that forms a part of the vacuum vessel so as to be released.

DESCRIPTION OF THE PREFERRED EMBODIMENTS

Hereinafter, embodiments of a solid-state imaging device according to the present invention will be described in detail with reference to the accompanying drawings. Also, the same components will be denoted with the same reference numerals in the description of the drawings, and overlapping description will be omitted.

Figure 1:
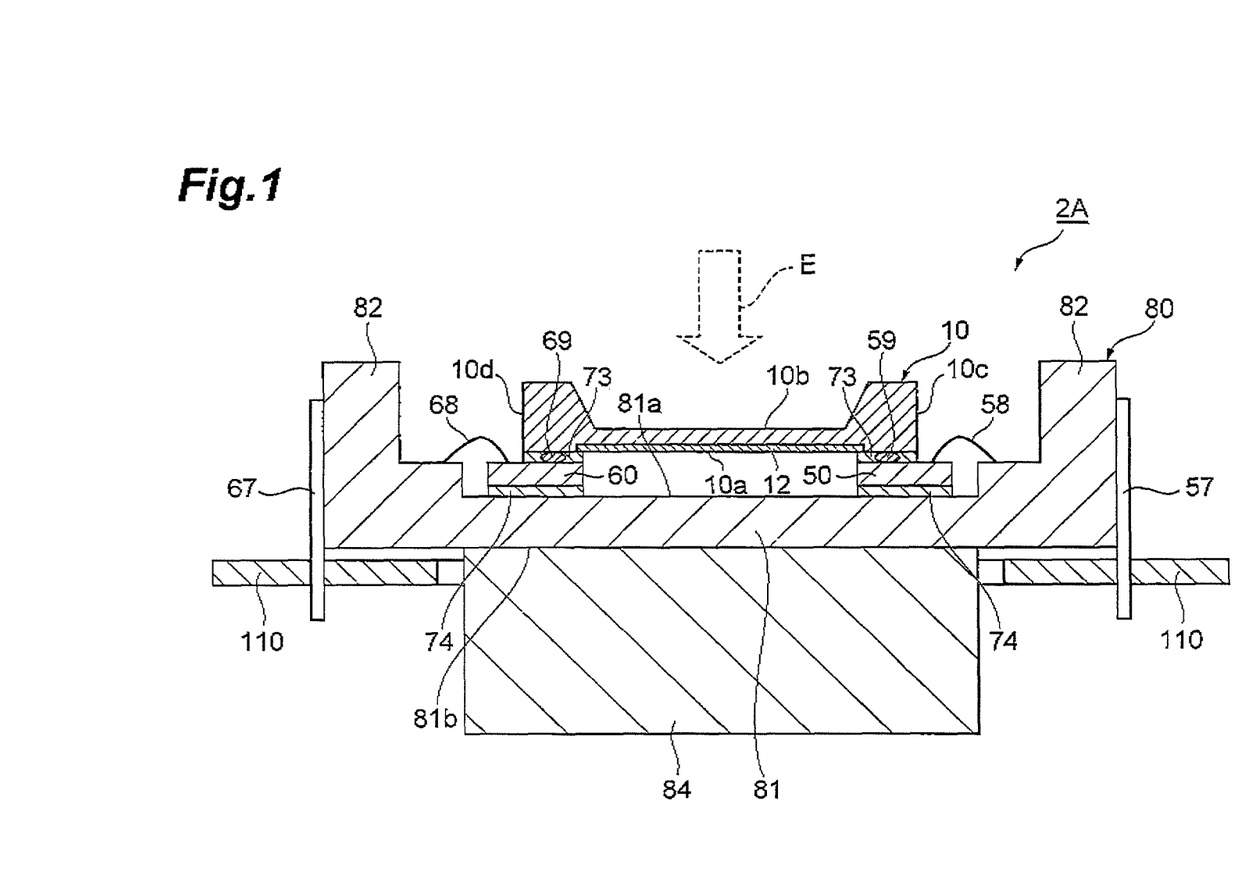
FIG. 1 is a side sectional view showing a configuration of a solid-state imaging device according to an embodiment of the present invention.

FIG. 1 is a side sectional view showing a configuration of a solid-state imaging device 2A according to an embodiment of the present invention. As shown in FIG. 1, the solid-state imaging device 2A includes a solid-state imaging element 10, two semiconductor elements 50 and 60, a heat transfer member 80, a cooling block 84, and a circuit board 110.

Figure 2:
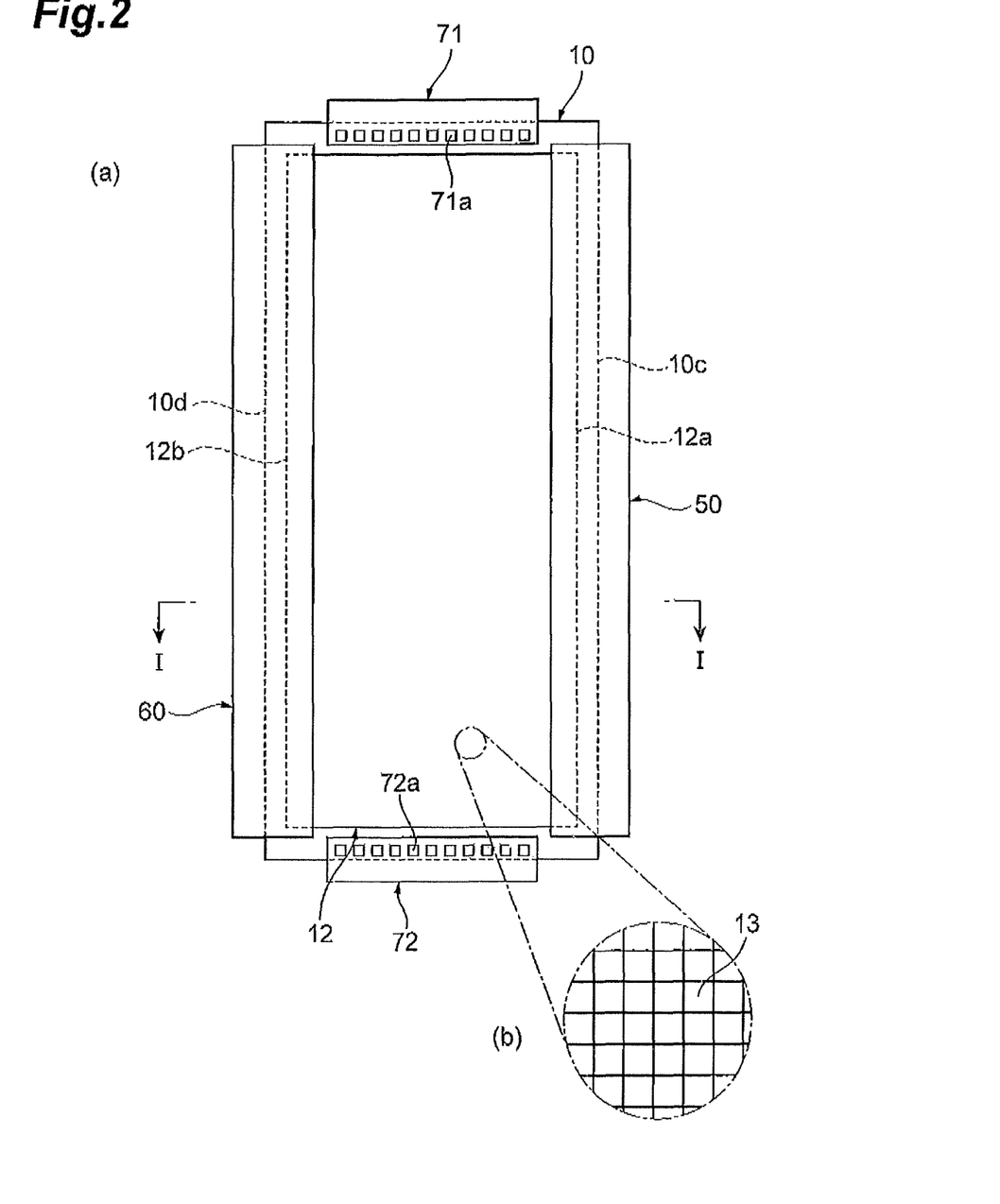
FIG. 2(a) is a plan view showing a configuration of a solid-state imaging element and two semiconductor elements.
FIG. 2(b) is a partially enlarged view of FIG. 2(a).

FIG. 2(a) is a plan view showing a configuration of the solid-state imaging element 10 and the two semiconductor elements 50 and 60. FIG. 2(b) is a partially enlarged view of FIG. 2(a). Also, FIG. 1 shows a section taken along a line I-I of the solid-state imaging device 2A shown in FIG. 2.

The solid-state imaging element 10 is a device containing charge coupled devices of a so-called CCD (Charge Coupled Device) type, and as shown in FIG. 1, shows a substrate form having a main surface 10a and a back surface 10b. The solid-state imaging element 10 has an imaging plane 12 and a first signal readout circuit and a second signal readout circuit in the main surface 10a. The imaging plane 12 is formed of M×N (M and N are integers not less than 2) pixels 13 that are two-dimensionally arrayed in M rows and N columns as shown in FIG. 2(b). M is, for example, 512, and N is, for example, 2048. Into the imaging plane 12, detection objects (light such as ultraviolet rays, radiation such as X-rays, or electron beams) E are made incident from the back surface 101) side of the solid-state imaging element 10. The imaging plane 12 images any of these detection objects. Also, the back surface 10b is thinned and depressed relative to an edge portion of the solid-state imaging element 10 so that detection objects E are sufficiently made incident into the imaging plane 12 on the main surface 10a side. In the respective pixels 13, charges according to the intensities of these detection objects E made incident into the imaging plane 12 are generated, and the charges are accumulated. On the respective pixels 13, M transfer electrodes (not shown) for transferring a charge in the column direction are disposed for each of the rows. To the M transfer electrodes, voltage signals (driving voltages) to control charge transfer in the column direction of the imaging plane 12 are supplied.

As shown in FIG. 2, the solid-state imaging device 2A of the present embodiment further includes two drive pad conversion substrates 71, 72. The drive pad conversion substrates 71, 72 are disposed along both end edges of the imaging plane 12 in the row direction, respectively, and fixed to the main surface 10a of the solid-state imaging element 10. The drive pad conversion substrate 71 (72) has at least three driving voltage pads 71a (72a) arrayed along the end edge of the imaging plane 12, and to these driving voltage pads 71a (72a), voltage signals (driving voltages) to control charge transfer are fed based on receiving a transfer signal generated by a transfer control section (described later). As will be described later, because a signal charge is transferred in either of the A1 direction and A2 direction (a first operation mode and second operation mode to be described later) of FIG. 3, the CCD of the solid-state imaging element 10 is formed with three phases, and voltages of mutually different phases are applied to these drive voltage pads 71a (72a). Because the electrodes of the respective phases are connected in the solid-state imaging element 10, it suffices to have three driving voltage pads 71a (72a). However, a single phase may be driven by a plurality of (k) amplifiers (drive circuits) in the case of transferring at high speed. In that case; the number of driving voltage pads 71a (72a) is (3×k).

Figure 3:
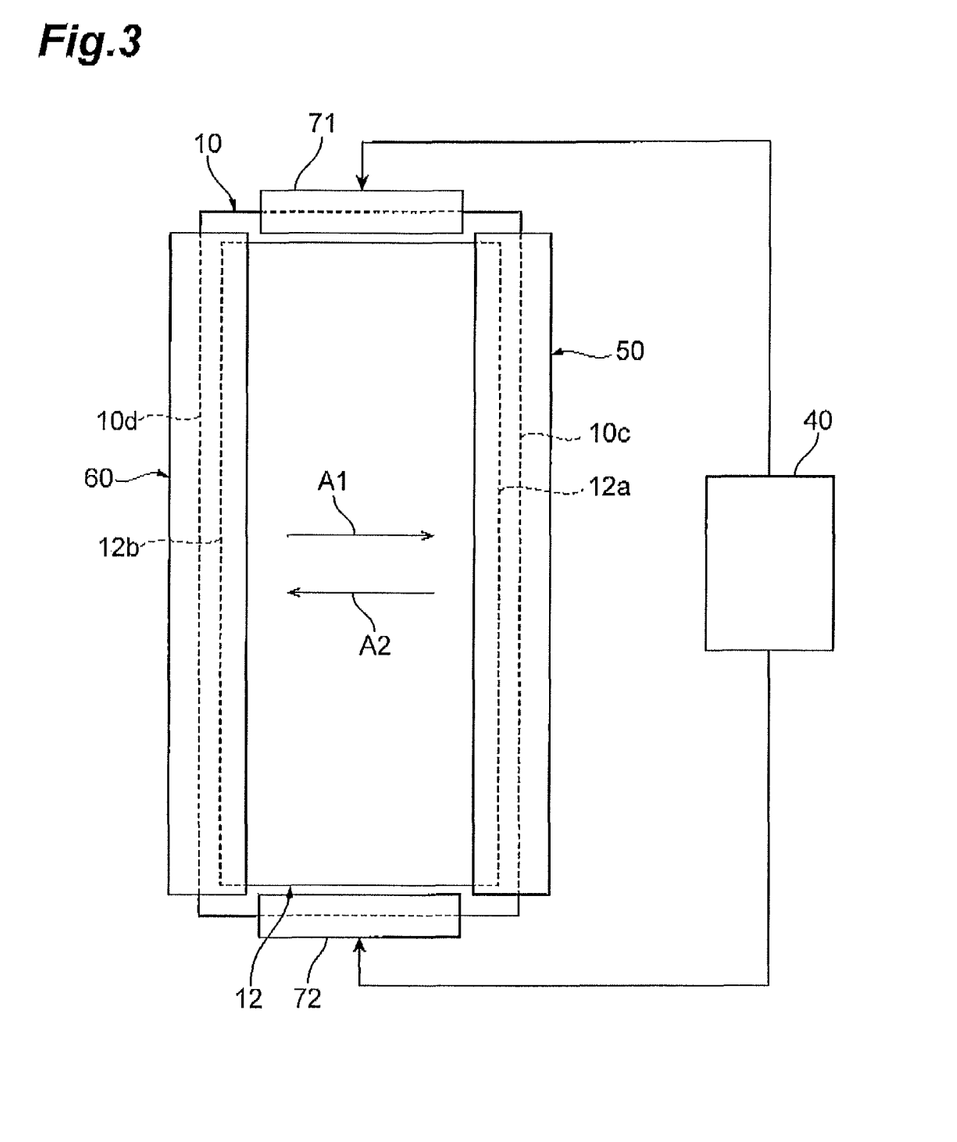
FIG. 3 is a block diagram schematically representing a transfer control section and a solid-state imaging element.

The solid-state imaging device 2A may further include a transfer control section for generating a voltage signal to control charge transfer. FIG. 3 is a block diagram schematically representing the transfer control section 40 and the solid-state imaging element 10. The transfer control section 40 generates three voltage signals to control charge transfer in the column direction, and feeds these voltage signals to the transfer electrodes via the drive pad conversion substrates 71, 72.

The imaging plane 12 has one end 12a and the other end 12b in the column direction. The transfer control section 40 has an operation mode (first operation mode) for transferring a charge in the direction (arrow A1 in the figure) from the other end 12b side to the one end 12a side of the imaging plane 12 in the column direction and an operation mode (second operation mode) for transferring a charge in the direction (arrow A2 in the figure) from the one end 12a side to the other end 12b side. On the other hand, the solid-state imaging element 10 has N signal readout circuits (first signal readout circuits) arrayed along the one end 12a of the imaging plane 12 and N signal readout circuits (second signal readout circuits) arrayed along the other end 12b of the imaging plane 12. In the first operation mode, an electrical signal according to the magnitude of a charge taken out of each column is output from the first signal readout circuit, and in the second operation mode, an electrical signal according to the magnitude of a charge taken out of each column is output from the second signal readout circuit.

The transfer control section 40 of the present embodiment can perform a TDI operation by making the moving speed and moving direction of a subject coincident with the transfer speed and transfer direction of a charge, respectively. That is, by transferring a charge with the same transfer speed as the moving speed of a subject moving in the column direction of the imaging plane 12 and transferring the charge in the first operation mode when the subject moves in the direction of arrow A1 and in the second operation mode when the subject moves in the direction of arrow A2, a charge according to the intensity of detection objects (light such as ultraviolet rays, radiation such as X-rays, or electron beams) E at a certain position of the subject can be continuously accumulated in parallel with the transfer operation.

Such a TDI operation will be described by specifically giving a certain single pixel column as an example. Into a pixel in the m-th row included in said pixel column, detection objects E are made incident from a certain part of a subject, and a charge is generated. The charge is transferred to a next-stage pixel in the (m+1)-th row, and accumulated in the pixel in the (m+1)-th row. Simultaneously therewith, said part of the subject relatively moves at the same speed as the transfer speed relative to the imaging plane 12. Therefore, detection objects E from the same part of the subject are made incident into the pixel in the (m+1)-th row, so that a charge is further generated in the pixel in the (m+1)-th row. Then, the charge accumulated in the pixel in the (m+1)-th row is transferred to a next-stage pixel in the (m+2)-th row. Thereafter, the same operation is repeated in the respective rows, so that a charge according to the intensity of detection objects E corresponding to said part of the subject is continuously accumulated over the plurality of rows. Accordingly, a clear image of the moving object can be prepared.

FIG. 1 and FIG. 2 are referred to again. The semiconductor element 50 is a first semiconductor element of the present embodiment. The semiconductor element 50 is mounted on the main surface 10a of the solid-state imaging element 10, along the one end 12a of the imaging plane 12, so as to cover the one end 12a. The semiconductor element 50 has, for example, a C-MOS semiconductor chip, converts electrical signals output from the foregoing first signal readout circuits for each of the columns to digital signals by a circuit built in the semiconductor chip, and sequentially outputs the digital signals of the respective columns to the outside of the solid-state imaging device 2A as serial signals.

The semiconductor element 60 is a second semiconductor element of the present embodiment. The semiconductor element 60 is mounted on the main surface 10a of the solid-state imaging element 10, along the other end 12b of the imaging plane 12, so as to cover the other end 12b. The semiconductor element 60 has, for example, a C-MOS semiconductor chip, converts electrical signals output from the foregoing second signal readout circuits for each of the columns to digital signals by a circuit built in the semiconductor chip, and sequentially outputs the digital signals of the respective columns to the outside of the solid-state imaging device 2A as serial signals.

Generally, because a CCD and a C-MOS are different in process from each other, a C-MOS-type digital conversion circuit and serial conversion circuit cannot be fabricated on the solid-state imaging element 10 that is a CCD type. It is indeed possible to form these circuits by a group of discrete circuit elements and ICs, but the number of columns N exceeding 100 results in a large mounting area, which therefore requires a long wiring of several tens of millimeters to connect the solid-state imaging element 10 and these circuits, so that noise is heavily superimposed and the readout rate (band) is limited.

As shown in FIG. 1, the semiconductor elements 50 and 60 are bonded to the solid-state imaging element 10 via a conductive material (for example, bump electrodes 59 and 69). An underfill 73 is provided around each of the bump electrodes 59 and 69, and the solid-state imaging element 10 and the semiconductor elements 50 and 60 are more strongly bonded by these underfills 73.

Figure 4:
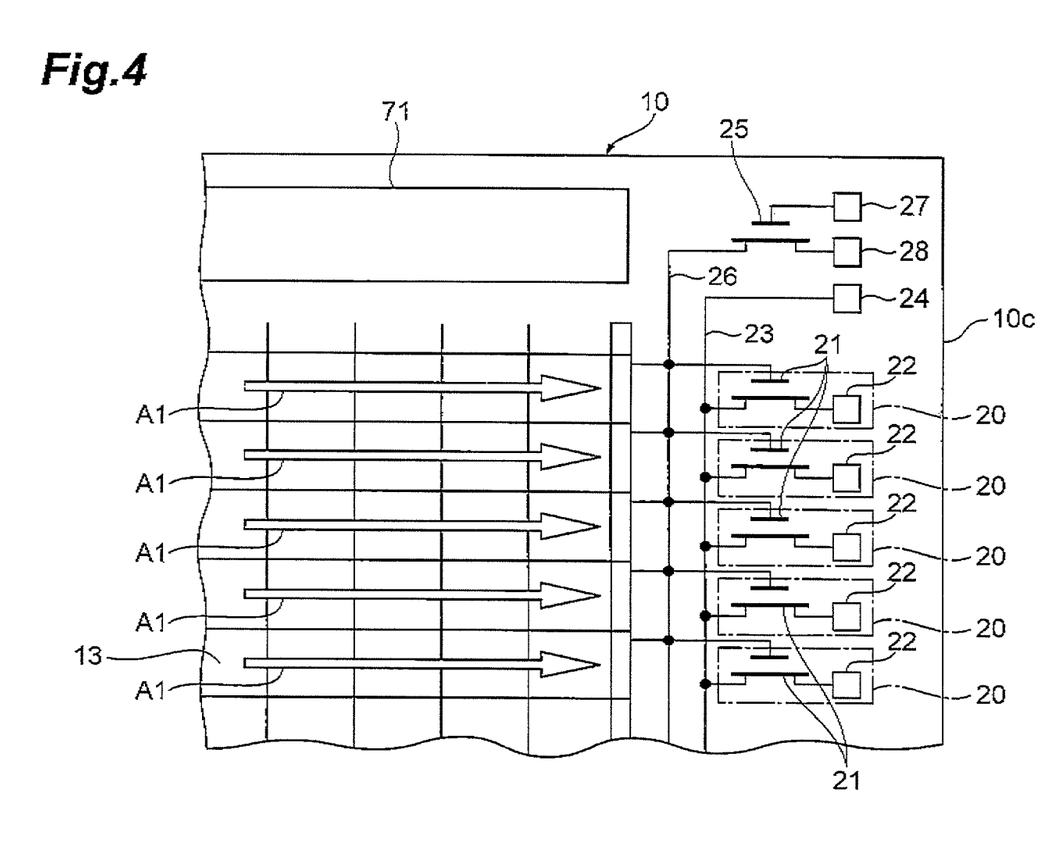
FIG. 4 is a plan view showing a configuration in the vicinity of one end of art imaging plane of the solid-state imaging element.

FIG. 4 is a plan view showing a configuration in the vicinity of the one end 12a of the imaging plane 12 of the solid-state imaging element 10. As previously mentioned, the solid-state imaging element 10 has the drive pad conversion substrates 71, 72 for receiving voltage signals to control charge transfer in the column direction from the transfer control section 40. To the transfer electrodes provided for each of the rows, these voltage signals are applied. The arrow A1 in the figure shows the charge transfer direction in the first operation mode.

Moreover, as previously mentioned, at the one end 12a of the imaging plane 12, N first signal readout circuits 20 are arranged for each of the columns. Each of these first signal readout circuits 20 has a transistor (a FET in the present embodiment) 21 and a signal output bonding pad 22. A control terminal (gate) of the transistor 21 is electrically connected with a terminal end of the one end 12a side of a corresponding pixel column in the imaging plane 12. The potential of this control terminal becomes larger as the amount of a charge taken out of said pixel column increases. One current terminal (drain) of the transistor 21 is electrically connected to a bonding pad 24 via a wiring 23 commonly provided over the N columns. To this bonding pad 24, a voltage of a predetermined magnitude is always applied. The other current terminal (source) of the transistor 21 is electrically connected to the signal output bonding pad 22. In the case of the first operation mode, when a charge is transferred up to the one end 12a in a certain pixel column, a voltage according to the amount of that charge is applied to the control terminal of the transistor 21 of said column. Accordingly, a current of a magnitude according to said amount of charge is output from the other current terminal of said transistor 21 and taken out via the signal output bonding pad 22.

Moreover, the solid-state imaging element 10 further has a transistor (a FET in the present embodiment) 25. The control terminals of the N transistors 21 are electrically connected, via a wiring 26 commonly provided over the N columns, to one current terminal (drain) of the transistor 25. Moreover, a control terminal (gate) and the other current terminal (source) of the transistor 25 are electrically connected to bonding pads 27 and 28, respectively. When each transistor 21 has output a current according to the amount of a transferred charge, a reset voltage is applied via the bonding pad 27 to the control terminal of the transistor 25. Accordingly, a charge accumulated in each column is released from the other current terminal of the transistor 25 via the bonding pad 28, and the control terminal voltage of each transistor 21 is reset.

Figure 5:
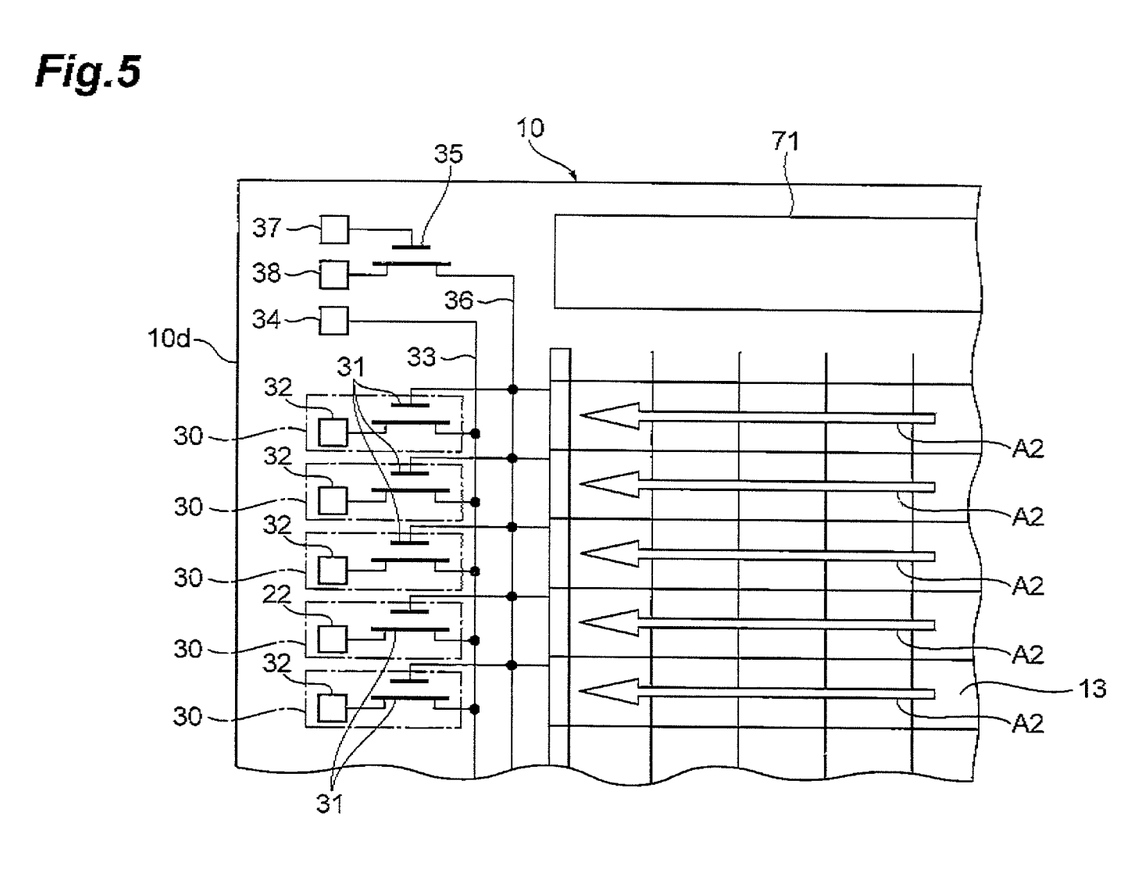
FIG. 5 is a plan view showing a configuration in the vicinity of the other end of an imaging plane of the solid-state imaging element.

FIG. 5 is a plan view showing a configuration in the vicinity of the other end 12b of the imaging plane 12 of the solid-state imaging element 10. The arrow A2 in the figure shows the charge transfer direction in the second operation mode. As previously mentioned, at the other end 12b of the imaging plane 12, N second signal readout circuits 30 are arranged. The circuit configuration of the second signal readout circuit 30 is the same as that of the above-mentioned first signal readout circuits 20 as to be described in the following.

Each of the N second signal readout circuits 30 has a transistor (a FET in the present embodiment) 31 and a signal output bonding pad 32. A control terminal (gate) of the transistor 31 is electrically connected with a terminal end of the other end 12b side of a corresponding pixel column in the imaging plane 12. The potential of this control terminal becomes larger as the amount of a charge taken out of said pixel column increases. One current terminal (drain) of the transistor 31 is electrically connected to a bonding pad 34 via a wiring 33 commonly provided over the N columns. To this bonding pad 34, a voltage of a predetermined magnitude is always applied. The other current terminal (source) of the transistor 31 is electrically connected to the signal output bonding pad 32. In the case of the second operation mode, when a charge is transferred up to the other end 12b in a certain pixel column, a voltage according to the amount of that charge is applied to the control terminal of the transistor 31 of said column. Accordingly, a current of a magnitude according to said amount of charge is output from the other current terminal of said transistor 31 and taken out via the signal output bonding pad 32.

Moreover, the solid-state imaging element 10 further has a transistor (a FET in the present embodiment) 35. The control terminals of the N transistors 31 are electrically connected, via a wiring 36 commonly provided over the N columns, to one current terminal (drain) of the transistor 35. Moreover, a control terminal (gate) and the other current terminal (source)

of the transistor 35 are electrically connected to bonding pads 37 and 38, respectively. When each transistor 31 has output a current according to the amount of a transferred charge, a reset voltage is applied via the bonding pad 37 to the control terminal of the transistor 35. Accordingly, a charge accumulated in each column is released from the other current terminal of the transistor 35 via the bonding pad 38, and the control terminal voltage of each transistor 31 is reset.

Figure 6:
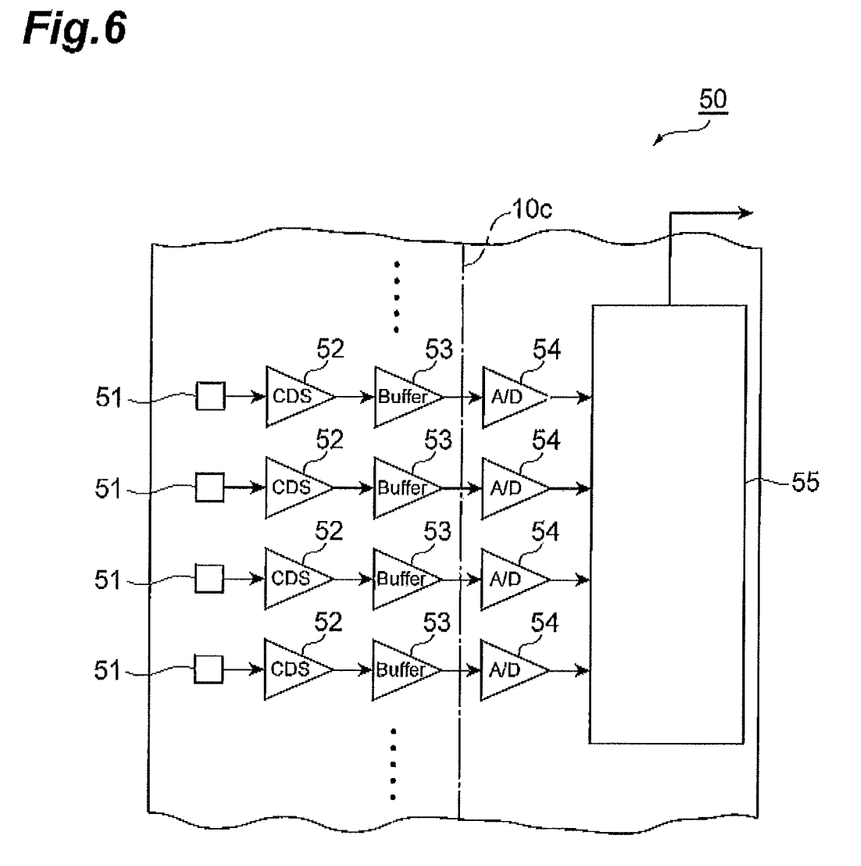
FIG. 6 is a bottom view showing a configuration of a first semiconductor element.

FIG. 6 is a bottom view showing a configuration of the semiconductor element 50. The semiconductor element 50 converts electrical signals output from the first signal readout circuits 20 provided in each of the N columns to digital signals, and sequentially outputs the digital signals of the respective columns to the outside of the solid-state imaging device 2A as serial signals. The semiconductor element 50 of the present embodiment has N bonding pads 51, N CDS (Correlated Double Sampling) circuits 52, N buffers 53, and N analog/digital converter circuits 54 provided corresponding to the respective columns, and a multiplexer 55.

Each of the N bonding pads 51 is electrically connected with each of the N signal output bonding pads 22 of the solid-state imaging element 10 via the bump electrode 59 (refer to FIG. 2). Moreover, each of the N CDS circuits 52 is input with an electrical signal output from each of the N first signal readout circuits 20 via the bonding pad 51, and reduces noise of the electrical signal. Examples of the noise to be removed by the CDS circuit 52 include reset noise of FDAs (Floating Diffusion Amplifiers) provided in the respective columns and offset FPN (Fixed Pattern Noise) at dark time. Each of the N buffers 53 is input with an electrical signal output from each of the N CDS circuits 52, and amplifies the electrical signal. Each of the N analog/digital conversion circuits 54 is input with an electrical signal output from each of the N buffers 53, and converts the electrical signal to a digital signal. The multiplexer 55 sequentially outputs digital signals of the respective columns output from the analog/digital converter circuits 54 to the outside of the solid-state imaging device 2A as serial signals. In addition, because variation in the gain of the FDA cannot be removed by the CDS circuit 52, a circuit for performing shading correction at the stage of a digital signal may be further added.

Figure 7:
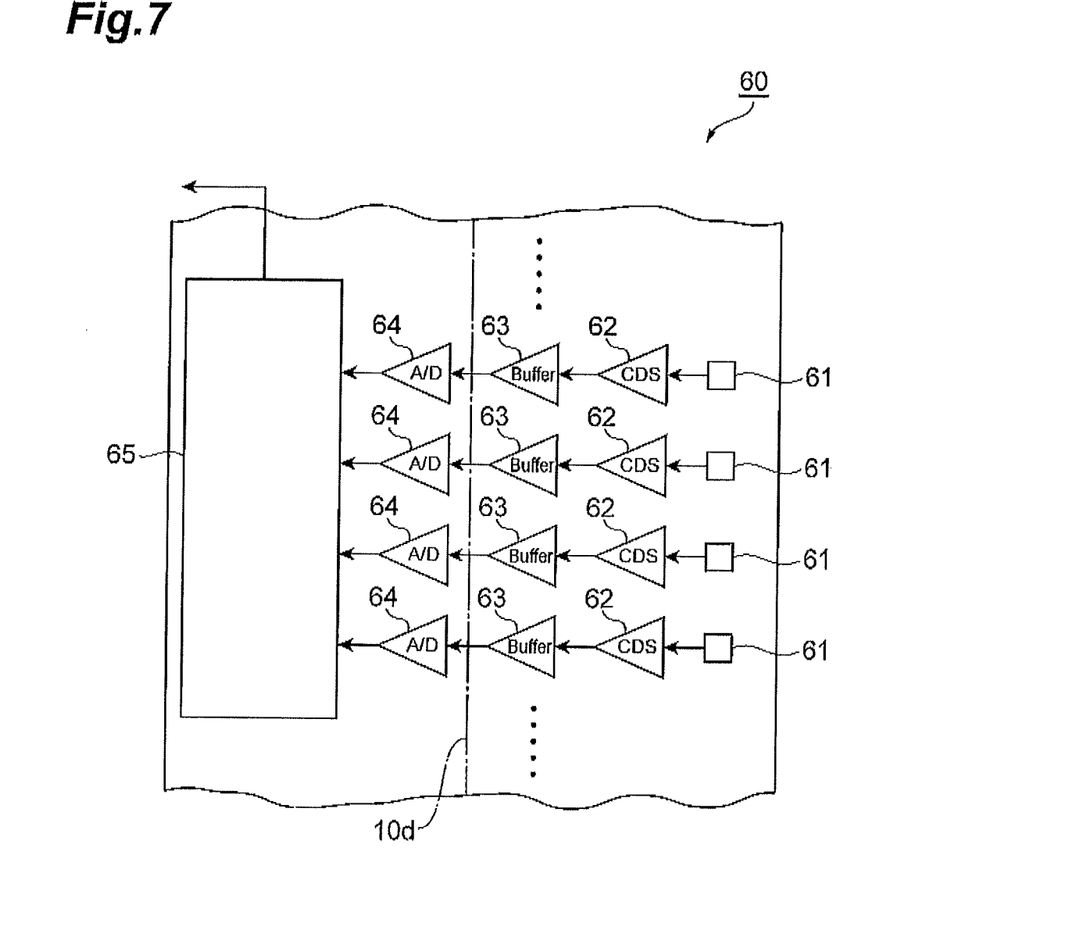
FIG. 7 is a bottom view showing a configuration of a second semiconductor element.

FIG. 7 is a bottom view showing a configuration of the semiconductor element 60. The semiconductor element 60 converts electrical signals output from the second signal readout circuits 30 provided in each of the N columns to digital signals, and sequentially outputs the digital signals of the respective columns to the outside of the solid-state imaging device 2A as serial signals. The semiconductor element 60 of the present embodiment has the same configuration as that of the above-mentioned semiconductor element 50. That is, the semiconductor element 60 has N bonding pads 61, N CDS circuits 62, N buffers 63, and N analog/digital converter circuits 64 provided corresponding to the respective columns, and a multiplexer 65.

Each of the N bonding pads 61 is electrically connected with each of the N signal output bonding pads 32 of the solid-state imaging element 10 via the bump electrode 69 (refer to FIG. 2). Moreover, each of the N CDS circuits 62 is input with an electrical signal output from each of the N second signal readout circuits 30 via the bonding pad 61, and reduces noise of the electrical signal. Each of the N buffers 63 is input with an electrical signal output from each of the N CDS circuits 62, and amplifies the electrical signal. Each of the N analog/digital conversion circuits 64 is input with an electrical signal output from each of the N buffers 63, and converts the electrical signal to a digital signal. The multiplexer 65 sequentially outputs digital signals of the respective columns output from the analog/digital converter circuits 64 to the outside of the solid-state imaging device 2A as serial signals.

Here, in FIG. 6 and FIG. 7, end edges 10c and 10d of the solid-state imaging element 10 are shown, respectively. The end edge 10c shown in FIG. 6 is an end edge of the solid-state imaging element 10 on the one end 12a side of the imaging plane 12, and the end edge 10d shown in FIG. 7 is an end edge of the solid-state imaging element 10 on the other end 12b side of the imaging plane 12. As shown in these figures, when viewed in a normal direction of the imaging plane 12 (a direction perpendicular to the imaging plane 12), the end edge 10c is located between the buffers 53 and the analog/digital converter circuits 54 of the semiconductor element 50, and the end edge 10d is located between the buffers 63 and the analog/digital converter circuits 64 of the semiconductor element 60. That is, in the present embodiment, the CDS circuits 52, 62 and the buffers 53, 63 are covered with the solid-state imaging element 10 when viewed in the normal direction of the imaging plane 12. Accordingly, the CDS circuits 52, 62 and the buffers 53, 63 can be suitably protected from detection objects E including light such as ultraviolet rays, radiation such as X-rays, or electron beams made incident into the solid-state imaging element 10.

In addition, the circuit elements of the semiconductor elements 50, 60 to be covered with the solid-state imaging element 10 can be changed according to necessity. As a result of at least one set of the CDS circuits 52, 62, the buffers 53, 63, the analog/digital converter circuits 54, 64, and the multiplexers 55, 65, said circuit elements can be suitably protected from detection objects E.

FIG. 1 is referred to again. As previously mentioned, the solid-state imaging device 2A includes a heat transfer member 80, a cooling block 84, and a circuit board 110.

The heat transfer member 80 is a member for dissipating heat generated in the solid-state imaging element 10 and the semiconductor elements 50, 60, and is made of an insulating material such as, for example, ceramic. The heat transfer member 80 has a plate-like portion 81 and a sidewall portion 82 provided around the plate-like portion 81. The plate-like portion 81 shows a plate form having a main surface 81a (first surface) and a back surface 81b (second surface), and on the main surface 81a, the solid-state imaging element 10 and the semiconductor elements 50, 60 are placed. In the present embodiment, the semiconductor elements 50, 60 are bonded to the main surface 81a via underfills 74. On the other hand, the sidewall portion 82 of the heat transfer member 80 is formed with a wiring pattern (not shown), and the semiconductor elements 50, 60 are electrically connected to the wiring pattern via bonding wires 58, 68. Also, the wiring pattern is connected with the circuit board 110 via pins 57, 67 provided at outer peripheral parts of the sidewall portion 82 of the heat transfer member 80.

The cooling block 84 is a cooling structure of the present embodiment, and is a member for dissipating heat generated in the solid-state imaging element 10 and the semiconductor elements 50, 60. The cooling block 84 is provided on the back surface 81b of the plate-like portion 81, and thermally coupled (suitably, bonded) with the plate-like portion 81. The cooling block 84 is preferably made of a material such as a metal excellent in thermal conductivity, and is suitably realized by, for example, a heat sink formed with a plurality of fins.

Effects to be obtained by the solid-state imaging device 2A according to the present embodiment described above will be described. In this solid-state imaging device 2A, the CCD-type solid-state imaging element 10 has the signal readout circuit 20 arranged at one end in the column direction (vertical direction) thereof, and further, to this signal readout circuit 20, the C-MOS-type semiconductor element 50 for a serial signal output is connected. By such a configuration, heat generation in the solid-state imaging element 10 can be reduced as compared with the case of providing a horizontal transfer circuit on the solid-state imaging element 10 that is a CCD type. Moreover, heat generation occurs in the semiconductor element 50, but by the above-described configuration, the semiconductor element 50 is thermally coupled with the cooling block 84 via the heat transfer member 80, so that heat in the semiconductor element 50 can be efficiently released.

Moreover, in this solid-state imaging device 2A, the N signal readout circuits 20 are arranged for each of the columns, and electrical signals are output from these signal readout circuits 20 to the semiconductor element 50 for each of the columns. Such a configuration allows dramatically reducing the number of readout columns per output port as compared to the conventional CCD that has output output signals of a plurality of columns from a single output port collectively. Therefore, the read-out rate per one output port can be held down, so that noise dependent on the magnitude of the frequency can be effectively reduced.

Thus, by the solid-state imaging device 2A according to the present embodiment, heat generated by a transfer operation when reading out in the horizontal direction can be efficiently released, and noise to be contained in an output signal can be reduced.

Moreover, as in the present embodiment, it is preferable that the solid-state imaging element 10 further has a signal readout circuit 30 arranged at the other end side in the column direction opposite the imaging plane 12, besides the signal readout circuit 20 arranged at one end side. In addition, it is preferable that, to the signal readout circuit 30, a semiconductor element 60 different from the semiconductor element 50 is connected. By such a configuration, in the case of performing a TDI operation in a direction from the other end side to one end side of the imaging plane 12, it suffices to transfer a charge in that direction, and convert the charge into a serial signal output by the signal readout circuit 20 and the semiconductor element 50. Moreover, in the case of performing a TDI operation in a direction from one end side to the other end side, it suffices to transfer a charge in that direction, and convert the charge into a serial signal output by the signal readout circuit 30 and the semiconductor element 60. Thus, by the above-described solid-state imaging device 2A of the present embodiment, the CCD charge transfer direction can be reversed. Therefore, when performing imaging by a TDI operation, a movement of the solid-state imaging device 2A can be reduced, so that the time required for imaging can be shortened.

In addition, similar to the semiconductor element 50, it suffices that the semiconductor element 60 and the main surface 81a of the heat transfer member 80 are bonded to each other. Accordingly, the semiconductor element 60 is thermally coupled with the cooling block 84 via the heat transfer member 80, so that heat in the semiconductor element 60 can be efficiently released.

Moreover, as in the present embodiment, it is preferable that the signal readout circuits 20, 30 of the solid-state imaging element 10 and the semiconductor elements 50, 60 are electrically connected to each other via bump electrode 59, 69. By such a configuration, as compared with such a case that, for example, the signal readout circuits 20, 30 and the semiconductor elements 50, 60 are connected via wires, heat generated in the solid-state imaging element 10 can be efficiently released to the cooling block 84 via the semiconductor elements 50, 60 and the heat transfer member 80.

Figure 8:
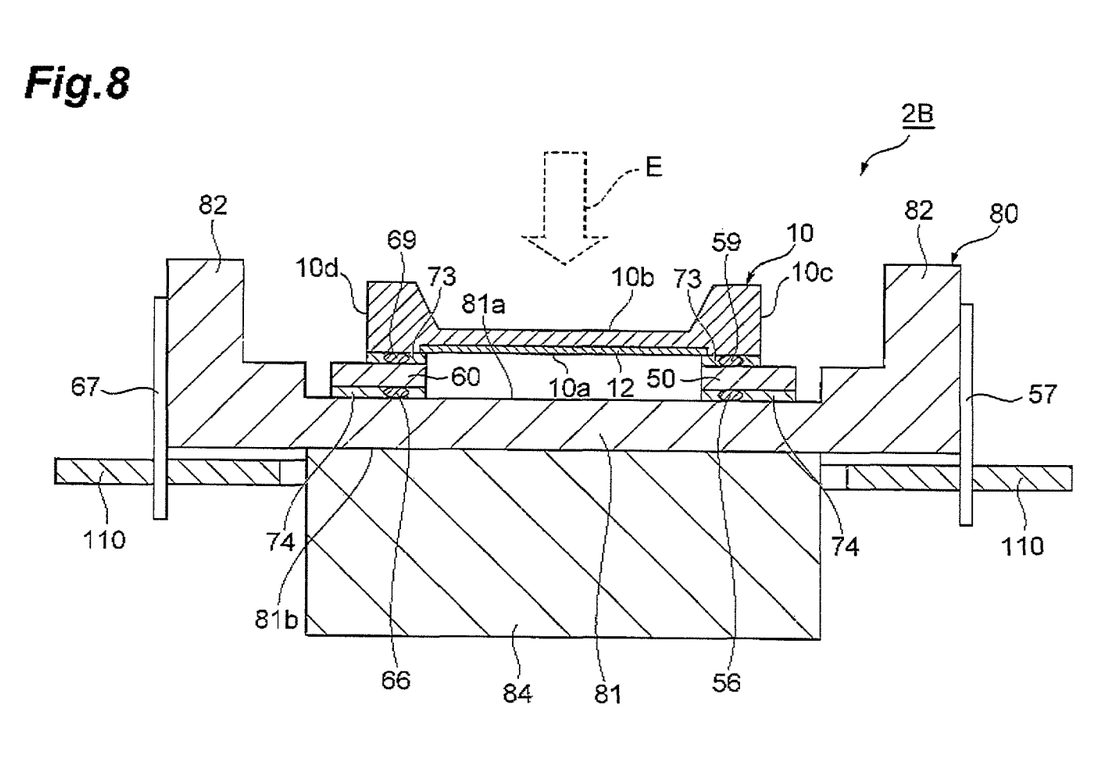
FIG. 8 is a sectional view showing a configuration of a solid-state imaging device according to a modification.

FIG. 8 is a sectional view showing a configuration of a solid-state imaging device 2B according to a modification of the present embodiment. The solid-state imaging device 213 shown in this modification and the foregoing solid-state imaging device 2A have a difference in the connection method between the semiconductor elements 50, 60 and the wiring pattern on the heat transfer member 80. In the present modification, there is a wiring pattern (not shown) provided on the main surface 81a of the heat transfer member 80, and the wiring pattern and the semiconductor elements 50, 60 are electrically connected to each other via bump electrodes 56, 66. By such a configuration, as compared with such a case that the semiconductor elements 50, 60 and the mounting pattern are connected via wires as in FIG. 1, heat generated in the semiconductor elements 50, 60 can be efficiently released to the cooling block 84 via the heat transfer member 80.

Figure 9:
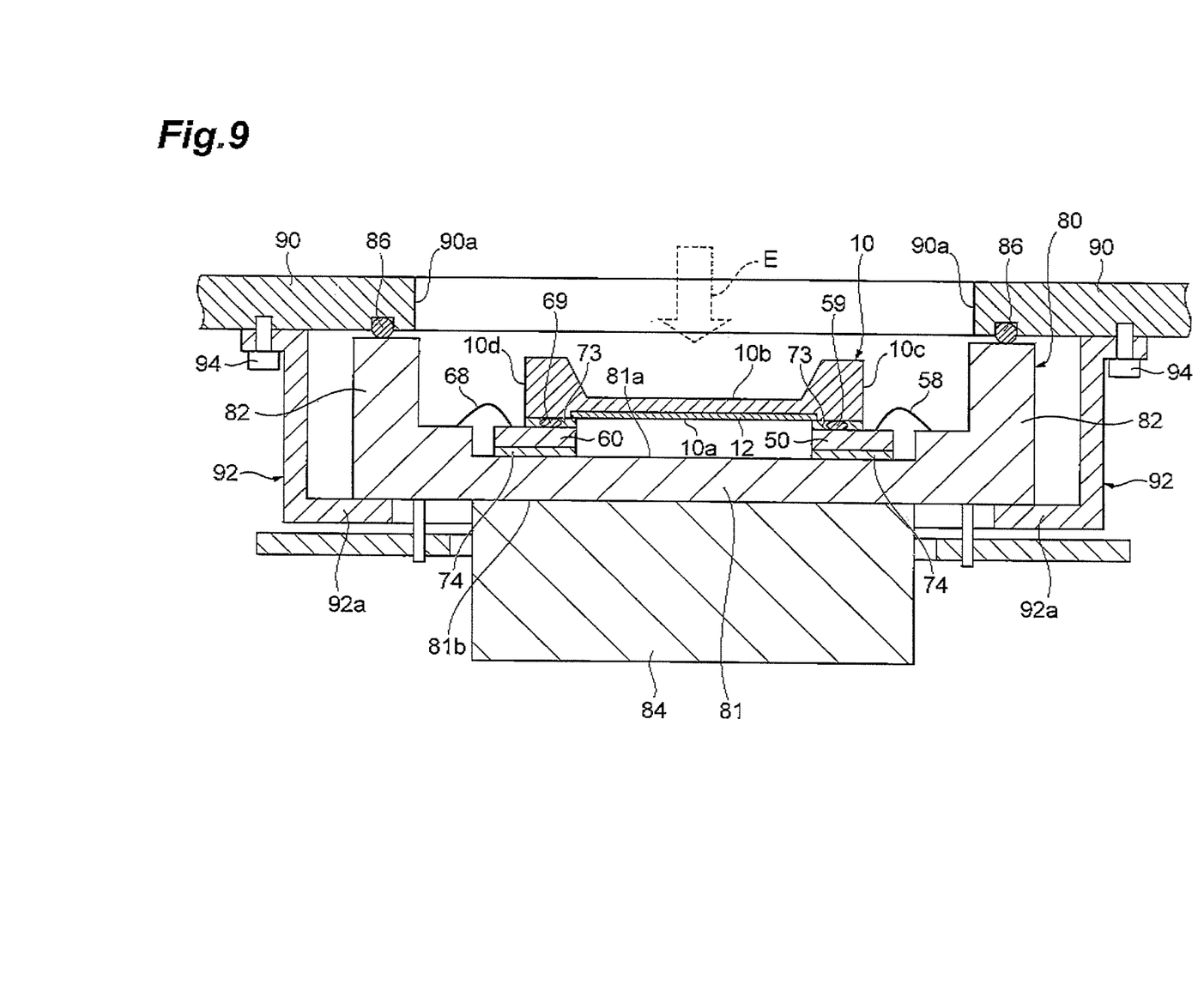
FIG. 9 is a sectional view showing a configuration of a solid-state imaging device according to another modification.

FIG. 9 is a sectional view showing a configuration of a solid-state imaging device 2C according to another modification of the present embodiment. The solid-state imaging device 2C shown in this modification further includes a vacuum vessel 90, besides the configuration of the foregoing solid-state imaging device 2A. In FIG. 9, a part (flange part) of the vacuum vessel 90 is shown. In addition, the heat transfer member 80, as a result of being fixed to this flange part, forms a part of the vacuum vessel 90.

Specifically, there is an opening 90a formed at a part of the vacuum vessel 90, and the heat transfer member 80 is arranged so as to cover the opening 90a. A peripheral edge portion of the opening 90a and a top surface of the sidewall portion 82 of the heat transfer member 80 are opposed to each other, and a gap therebetween is vacuum sealed by an O-ring 86. The main surface 81a of the heat transfer member 80 is oriented to the inside of the vacuum vessel 90, and the solid-state imaging element 10 and the semiconductor elements 50, 60 are arranged in the vacuum vessel 90. On the other hand, because the back surface 81b of the heat transfer member 80 is oriented to the outside of the vacuum vessel 90, the cooling block 84 is arranged out of the vacuum vessel 90.

Moreover, to the vacuum vessel 90, a pressing member 92 is attached. The pressing member 92 is for pressing the solid-state imaging device 2C against the vacuum vessel 90, and encloses the solid-state imaging device 2C. In addition, an annular bottom plate part 92a formed at one end of the pressing member 92 is in contact with the back surface 81b of the heat transfer member 80 of the solid-state imaging device 2C, and the other end of the pressing member 92 is fixed to the vacuum vessel 90 by a bolt 94. By such a configuration, to the solid-state imaging device 2C, a pressing force in a direction to approach the vacuum vessel 90 is applied.

By the configuration of the present modification, detection objects E including electron beams and X-rays that are generated in the vacuum vessel 90 can be efficiently imaged in the vacuum vessel 90. Normally, in a vacuum, heat generated in a solid-state imaging device is hard to be released, but by the configuration of the present modification, heat generated in the solid-state imaging element 10 and the semiconductor elements 50, 60 can be efficiently transferred to the cooling block 84 via the heat transfer member 80 that forms a part of the vacuum vessel 90 so as to be released.

The solid-state imaging device according to the present invention is not limited to the foregoing embodiment and modifications, and various other modifications can be made. For example, in the above-described embodiment, an example where a first signal readout circuit and a first semiconductor element are provided at one end side of an imaging plane in the column direction and a second signal readout circuit and a second semiconductor element are provided at the other end side has been given, but the solid-state imaging device according to the present invention may include a configuration where a signal readout circuit and a semiconductor element are provided only at one end side of an imaging plane. Even in such a case, an effect of the present invention of efficiently releasing heat generated by a transfer operation when reading out in the horizontal direction and reducing noise to be contained in an output signal can be suitably provided.

By the solid-state imaging device according to the present invention, in a CCD-type solid-state imaging device, heat generated by a transfer operation when reading out in the horizontal direction can be efficiently released, and noise to be contained in an output signal can be reduced.

What is claimed is:

1. A solid-state imaging device comprising:
a CCD-type solid-state imaging element having an imaging plane formed of M×N (M and N are integers not less than 2) pixels that are two-dimensionally arrayed in M rows and N columns and N first signal readout circuits arranged on one end of the imaging plane in the column direction for each of the columns with respect to the imaging plane and for outputting electrical signals according to magnitudes of charges taken out of the respective columns, respectively;
a C-MOS-type first semiconductor circuit for converting electrical signals output from the first signal readout circuits for each of the columns to digital signals, and sequentially outputting the digital signals of the respective columns as serial signals;
a heat transfer member having a first surface and a second surface; and
a cooling structure provided on the second surface; wherein:
the first semiconductor circuit and the first surface of the heat transfer member are bonded to each other;
the solid-state imaging element has N second signal readout circuits arranged on an other end of the imaging plane in the column direction for each of the columns with respect to the imaging plane and for outputting electrical signals according to magnitudes of charges taken out of the respective columns, respectively;
the solid-state imaging device includes a C-MOS-type second semiconductor circuit for converting electrical signals output from the second signal readout circuits for each of the columns to digital signals, and sequentially outputting the digital signals of the respective columns as serial signals;
the second semiconductor circuit and the first surface of the heat transfer member are bonded to each other;
the imaging plane and the first and second signal readout circuits are formed in a main surface of the solid-state imaging element;
the first semiconductor circuit is mounted on the main surface of the solid-state imaging element along the one end of the imaging plane in the column direction, the first semiconductor circuit covers the one end, each of N bonding pads of the first semiconductor circuit is electrically connected with, and faces in a normal direction of the imaging plane, one of N signal output bonding pads of the first signal readout circuits, and at least one of a plurality of circuits provided in the first semiconductor circuit is covered with the solid-state imaging element when viewed in a normal direction of the imaging plane;
the second semiconductor circuit is mounted on the main surface of the solid-state imaging element along the other end of the imaging plane in the column direction, the second semiconductor circuit covers the other end, each of N bonding pads of the second semiconductor circuit is electrically connected with, and faces in a normal direction of the imaging plane, one of N signal output bonding pads of the second signal readout circuits, and at least one of a plurality of circuits provided in the second semiconductor circuit is covered with the solid-state imaging element when viewed in the normal direction of the imaging plane; and
the first semiconductor circuit and the second semiconductor circuit are bonded to the first surface of the heat transfer member via underfills.

2. The solid-state imaging device according to claim 1, wherein
the first semiconductor circuit includes:
a correlated double sampling circuit for reducing noise of electrical signals output for each of the columns from the first signal readout circuits;
a buffer for amplifying a signal output from the correlated double sampling circuit;
an analog/digital converter circuit for converting a signal output from the buffer to a digital signal; and
a multiplexer for sequentially outputting the digital signals of the respective columns output from the analog/digital converter circuit as serial signals.

3. The solid-state imaging device according to claim 2, wherein at least one of the correlated double sampling circuit, the buffer, the analog/digital converter circuit, and the multiplexer is covered with the solid-state imaging element when viewed in a normal direction of the imaging plane.

4. The solid-state imaging device according to claim 1, wherein the first signal readout circuit of the solid-state imaging element and the first semiconductor circuit are electrically connected to each other via a bump electrode.

5. The solid-state imaging device according to claim 1, wherein a mounting pattern is provided on the first surface of the heat transfer member, and
the first semiconductor circuit and the mounting pattern are electrically connected to each other via a bump electrode.

6. The solid-state imaging device according to claim 1, wherein the heat transfer member is made of an insulating material.

7. The solid-state imaging device according to claim 6, wherein the insulating material is ceramic.

8. The solid-state imaging device according to claim 1, wherein the imaging plane images any of the electron beams, X-rays, and ultraviolet rays.

9. The solid-state imaging device according to claim 1, wherein the heat transfer member forms a part of a vacuum vessel,
the solid-state imaging element and the first semiconductor circuit are arranged in the vacuum vessel, and
the cooling structure is arranged out of the vacuum vessel.

* * * * *